73-152
7/13/76    SR    XR    3,968,691

United States Patent [19]
Balkanli

[11] 3,968,691
[45] July 13, 1976

[54] ENVIRONMENTAL CONDITION SENSING APPARATUS

[75] Inventor: Hayati Balkanli, Houston, Tex.

[73] Assignee: Lynes, Inc., Houston, Tex.

[22] Filed: Mar. 13, 1974

[21] Appl. No.: 450,819

[52] U.S. Cl................................... 73/345; 73/152; 340/204; 340/206
[51] Int. Cl.²........................................ E21B 47/06
[58] Field of Search................. 73/345, 344, 398 R, 73/418, 170 R, 152, 151; 250/231 P, 231 R; 340/18 CM, 347 M, 189 M, 204, 206; 179/15 BM; 318/599

[56] References Cited
UNITED STATES PATENTS

| | | | |
|---|---|---|---|
| 2,419,292 | 4/1947 | Shepard, Jr. | 179/15 BM |
| 2,955,463 | 10/1960 | Godbey et al. | 73/152 |
| 3,077,670 | 2/1963 | Waters | 73/151 |
| 3,237,012 | 2/1966 | Treffeisen | 250/231 P |
| 3,273,393 | 9/1966 | Spark | 340/189 M |
| 3,279,258 | 10/1966 | Stacey | 73/152 |
| 3,311,876 | 3/1967 | Lee | 73/151 |
| 3,549,897 | 12/1970 | Blake | 250/231 |
| 3,742,233 | 6/1973 | Gorgens et al. | 250/231 R |

*Primary Examiner*—S. Clement Swisher
*Assistant Examiner*—Denis E. Corr
*Attorney, Agent, or Firm*—Jack W. Hayden

[57] ABSTRACT

A Bourdon tube is situated down hole in an oil well or the like, and has attached thereto a coded wheel which rotates an amount determined by the sensed down hole pressure. The wheel has a number of transparent and opaque concentric bands thereon which form a gray code pattern indicative of a selected range of pressures. A plurality of radiant energy transmitters are radially positioned on one side of the wheel in optical alignment with each of the respective bands. A plurality of radiant energy sensors are positioned and aligned in a like manner on the other side of the wheel for sensing the passing or blocking of the radiant energy by the respective bands formed on the wheel. Included is a digital logic circuit controlled by a temperature responsive oscillator which provides timing signals having a frequency determined by the sensed down hole temperature. The logic circuit responds to the signals sensed by the sensors for providing a binary coded output signal indicative of the sensed down hole pressure and temperature, wherein the sequence of the bits in the signal is indicative of the pressure and the frequency of the signal is indicative of the temperature.

11 Claims, 19 Drawing Figures

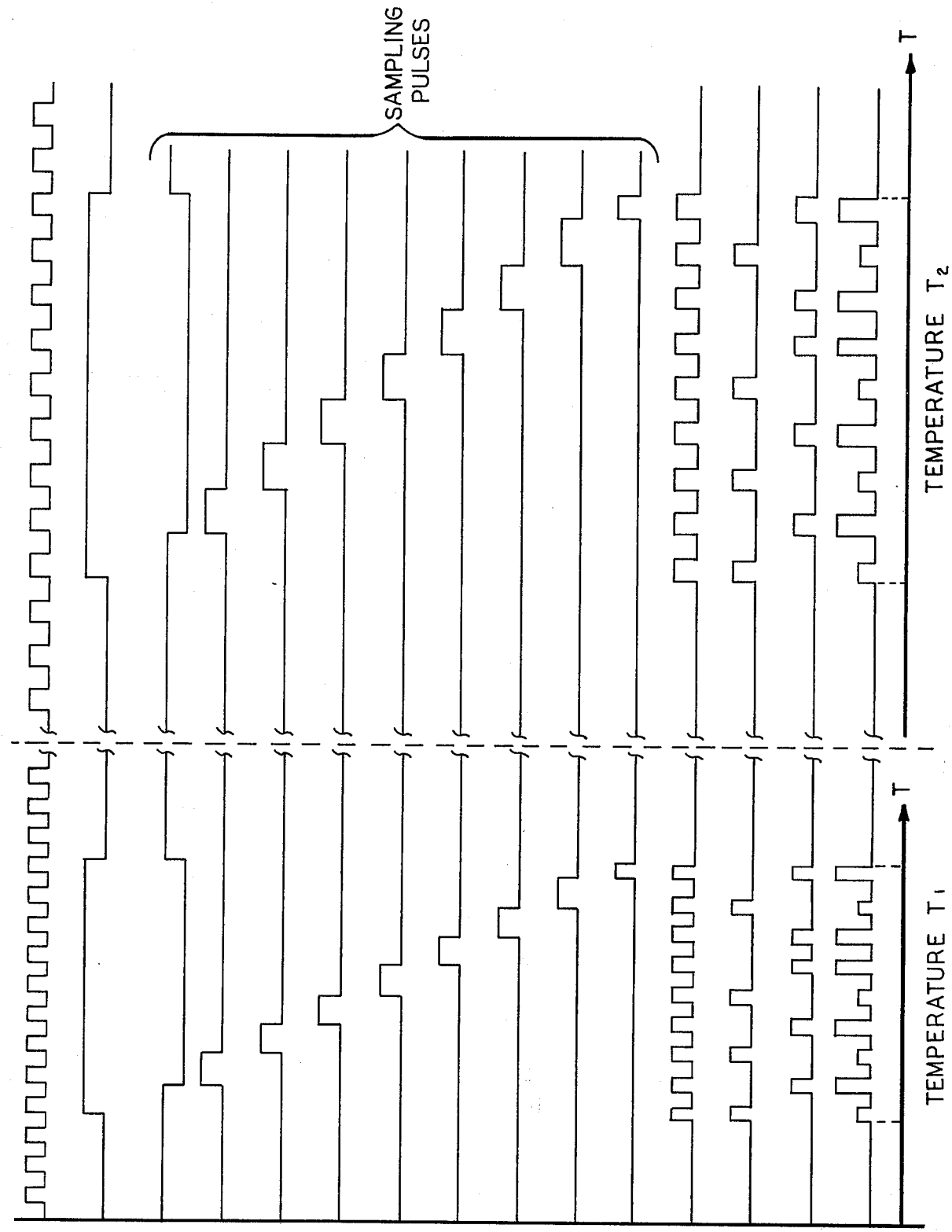

ENVIRONMENTAL CONDITION SENSING APPARATUS

BACKGROUND OF THE INVENTION

Generally, the present invention is directed to measuring environmental conditions such as pressure, temperature, humidity, velocity, fluid displacements or movement, presence or absence of certain elements in the environment, and the like. Specifically, the presently preferred embodiment of the invention is directed to measuring down hole pressure and temperature of an oil well. It is to be appreciated, however, that the present invention is applicable to a wide spectrum of environmental condition measurement applications both above and below ground. For example, it is believed that the teachings of the present invention are also applicable to anti-pollution measuring applications.

There are a number of down hole pressure and temperature measuring devices known in the art, each having certain advantages and disadvantages. Generally, the prior art devices measure pressure by analog techniques, such as current measurement, and accordingly, the accuracy of the measurement is dependent upon the length of the electrical wire from the measuring device down hole to the remote indicator or recorder which monitors the measurement. This is so, since the length of the wire may vary from well to well due to depth of the hole and the distance of the indicator or recorder from the hole. Also, the resistance of the electrical wire may vary due to temperature variations in the hole. Current leakage may also occur which further degrades the accuracy of the measurement. Another problem is that often times small motors or the like are used with the measuring apparatus which increases the cost as well as the size of the apparatus. Further, calibration accuracy of the known measuring devices is of prime concern due to the above-named variations which have to be compensated for.

According to the present invention, down hole pressure and temperature are concurrently measured utilizing digital techniques in place of analog techniques. Also, radiant energy sources and sensors as well as a relatively small coded wheel are used in place of certain of the analog elements, which is believed to reduce the size of the apparatus while increasing the accuracy of the apparatus. Since the pressure and temperature are concurrently monitored to provide a composite signal indicative of each, the effect of the temperature on the pressure is readily ascertainable. Further, since digital techniques are used rather than analog techniques, the accuracy of the measurement is not effected due to the length of the wire from the hole to the recorder or indicator. The environmental condition measuring apparatus of the present invention is believed to have eliminated or at least substantially reduced the measuring inaccuracies inherent in known devices as set forth above, as well as substantially reducing the size of the apparatus used.

SUMMARY OF THE INVENTION

According to the teachings of the present invention, environmental condition responsive apparatus includes means for sensing a first environmental condition, which includes means for providing a coded word having a code sequence indicative of the first environmental condition sensed. There is means for sensing a second environmental condition, including means for providing a timing signal having a frequency indicative of the second environmental condition sensed. Lastly, there is means for providing a coded environmental condition indicating signal in response to the provision of the coded word and the timing signal, wherein the coded environmental condition indicating signal has a code sequence indicative of the first environmental condition sensed and has a frequency indicative of the second environmental condition sensed.

BRIEF DESCRIPTION OF THE DRAWINGS

FIGS. 5A–5P are waveshape relationship diagrams of certain waveshapes present in the circuit of FIG. 4.

DESCRIPTION OF THE PREFERRED EMBODIMENT

Figure 1:
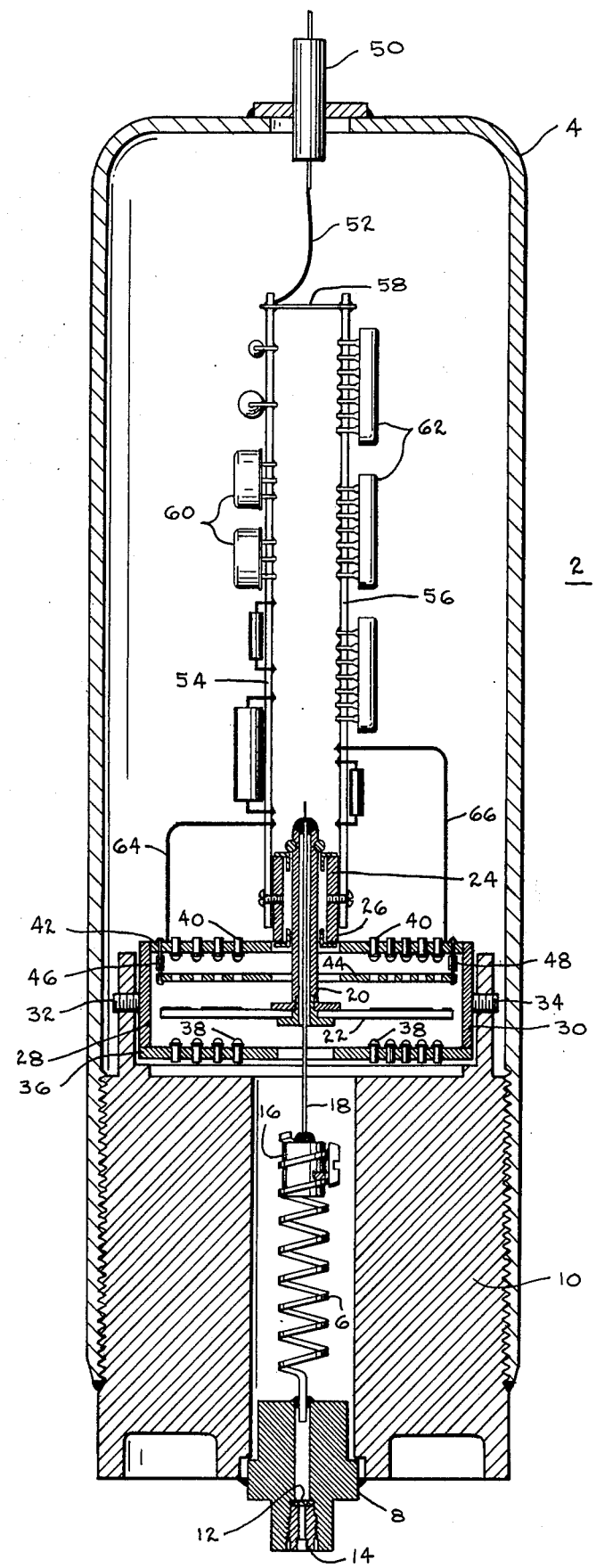
FIG. 1 is a perspective view in section of a digital environmental condition sensor according to the present invention.

FIG. 1 illustrates environmental condition sensing apparatus which may be used in any number of environments for sensing the conditions thereof. Specifically, the apparatus is directed to sensing the environmental conditions down hole in an oil well, and in this instance the sensing of the down hole pressure and temperature. The environmental condition sensing apparatus 2 is comprised of a housing 4 which includes a Bourdon tube 6 which is secured at one end thereof in a Bourdon tube holder 8 which is secured to a Bourdon tube housing 10 by suitable fastening means (not shown). A filter 12 allows gas or the like to be sensed through an opening 14 for determining the pressure and temperature thereof. The Bourdon tube 6 is attached to a coupler 16 which has a coupling wire 18 attached thereto which in turn is attached to a code wheel shaft 20. The shaft 20 has a code wheel 22 attached thereto such that the code wheel rotates in accordance with the rotation of the Bourdon tube 6, which rotation is indicative of the pressure of the gas sensed. The code wheel shaft 20 turns in bearings 26 formed in a code wheel housing 24. The circumferential edge 28 is attached to the Bourdon tube housing 10 by set screws 32 and 34. Attached to the upstanding edge 28 intermediate the Bourdon tube housing and the code wheel 22 is an emitter board 36 which has radiant energy transmitters 38 situated at spaced increments therein. The code wheel has a gray code pattern plated thereon forming concentric bands, which code when read is indicative of the amount of rotation of the Bourdon tube 6, and therefore is indicative of the pressure sensed by the tube. The radiant energy transmitters 38 are each aligned with a given one of the concentric bands, such that the light from a given transmitter is passed or blocked by a given band dependent upon the code appearing directly above the given transmitter. This will be described in more detail shortly in relation to FIGS. 2 and 3. Attached to the edge 28 above the code wheel 22 is a sensor board 42 which has a number of radiant energy sensors 40 positioned therein each being in radial alignment with given ones of the transmitters 38. A gating window 44 is attached to the sensor board 42 by screws 46 and 48. The gating window has a number of apertures therein each of which is in radial alignment with given ones of transmitters and sensors, such that any light passed by the code wheel is passed through the respective apertures in the gating window to the sensors. Each aperture in the gating window has a width which is substantially equal to the width of a least significant bit (LSB) code indication on the code wheel.

A header 50 is sealably mounted in the top-most portion of the housing 4, and has passed therethrough a plurality of lines as indicated at 52, which lines for example may be representative of a power input line, as well as a digital information output line. The power line is connected to a control board 54 as well as a logic board 56 with a connection 58 between the boards 54 and 56 being representative of control and power lines. The control board 54 has a number of elements such as 60 attached thereto which may take different forms dependent upon the power design chosen by a particular engineer. Likewise, the logic board 56 has a number of logic elements 62 attached thereto which may form the logic elements comprising the digital coding system according to the present invention. A plurality of conductors 64 are connected between the control board 54 and the sensor board 42, for applying power to the sensor board as well as to the emitter board. A plurality of conductors 66 are attached between the logic board 56 and the sensor board 42 for connecting the output of the sensors to the logic board such that the logic network may act upon the signals sensed to provide a digital output signal indicative of the pressure and temperature sensed down hole. The temperature sensing apparatus may be located anywhere within the Bourdon tube housing 4 for sensing the temperature therein and is connected to the logic board for reasons to be explained shortly.

Figure 2:
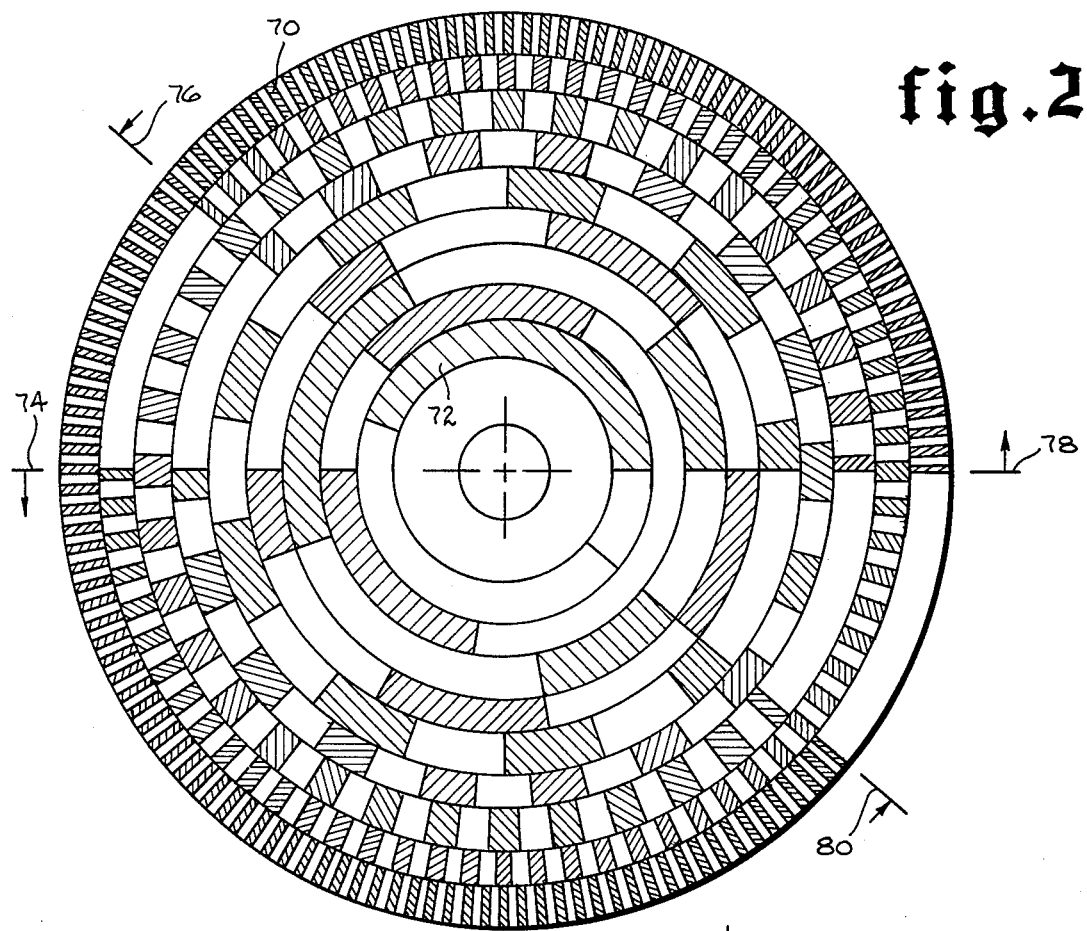
FIG. 2 is a diagram of a code wheel which may be used in the environmental condition sensor illustrated in FIG. 1.

Refer now to FIG. 2 which is a detailed diagram of the code wheel. The code wheel is made of quartz having optical quality. One face of the code wheel is metallized according to the gray code used. Regions of the wheel which are to represent a logic zero condition are made opaque by the metallizing technique as indicated by the shaded areas, whereas the regions which are to be indicative of a logic one condition are left transparent as indicated by the unshaded areas. The code pattern is deposited by metallization of the surface, in such a way that the sequential increase in coded numbers (for example gray coded numbers) are in a counterclockwise direction. The weight of the bits is in increasing numbers from 1 to 9, with the first or least significant bit (LSB) being situated on the outermost band 70, with the ninth bit being situated at the innermost band 72. The intermediate bands are clearly recognizable from the figure. The code wheel shown is for a two phase configuration, that is the even number bits are sensed along a given radius, whereas the uneven bits are sensed along a second radius, for example 180° removed from the one radius. This will be more clearly seen in relation to FIG. 3. It is to be appreciated however that the invention may be practiced utilizing any phased code wheel from a single phase, where the sensors are along a single radius, to multiple phase, where the sensors are along a plurality of radii. For example if a three phase code wheel is utilized the sensors may be placed along three radii which are spaced 120° apart. It is to be understood however that the degree of spacing is the designer's choice with the only constraint being that the sensors do not touch one another. For rotation of the wheel the zero starting point for the even numbered bits is indicated by the line 74 and the end region for the even numbered bits is indicated by the line 76. The zero starting point for the odd numbered bits is indicated by the line 78 and the end point for the odd numbered bits is indicated by the line 80. It is to be appreciated that any number of code wheels different than the one illustrated may be utilized in the practice of the present invention. For example, code wheels may be utilized wherein less than 360° of the wheel is utilized, for example as little as 120° of the wheel may be utilized and coded.

Figure 3:
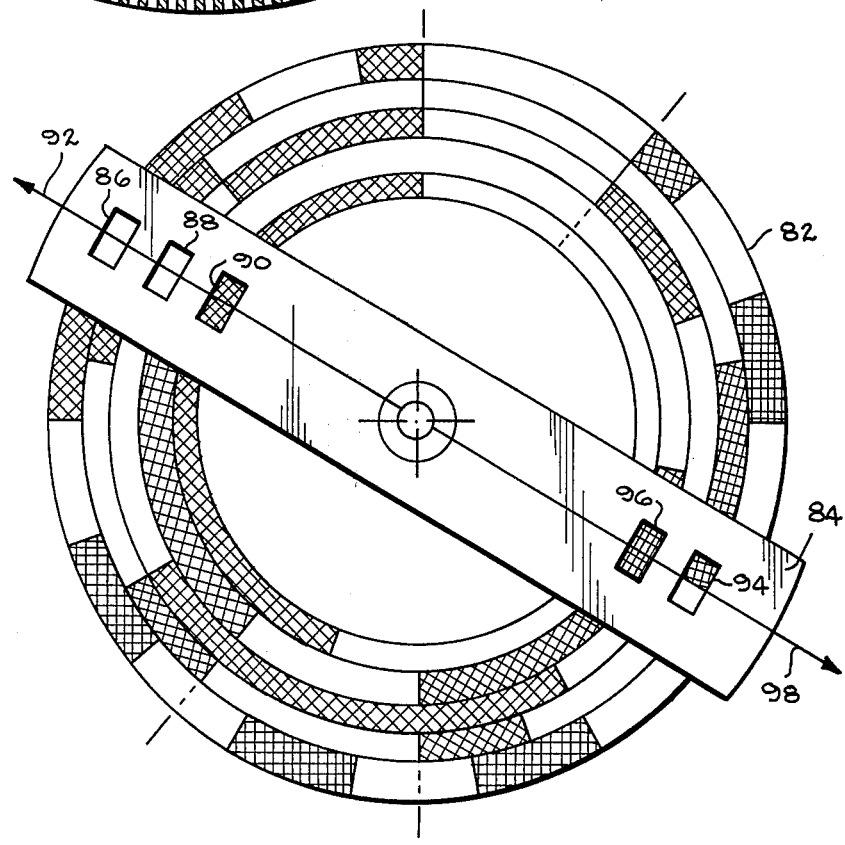
FIG. 3 is a diagram illustrating the placement of gating windows in relation to the code wheel.

Refer now to FIG. 3 which illustrates a two phase code wheel 82 for a system in which only five bits are utilized. It is to be remembered that the code wheel in FIG. 2 was for a nine bit system, however a 5 bit system is illustrated in FIG. 3 for a clearer representation of the positioning of a stationary gating window 84 in relation to the wheel. Apertures 86, 88 and 90 are situated in radial alignment with the odd bit concentric bands 1, 3 and 5 along a first radius 92. Windows 94 and 96 are positioned in radial alignment with the concentric bands indicative of even numbered bits 2 and 4 along a second radius 98 which is displaced 180° from the radius 92. The placement of alternate gating windows on different radii results in a smaller diameter of the code wheel since the respective concentric bands may be made smaller in diameter since the sensors operative with the respective gating windows need not be placed as close to one another as is the case if a one phase system is used, that is a system where consecutive gating windows are in radial alignment along a single radius. This is of primary concern when the code wheel is used in an environment where space is a primary consideration. It is well known that in apparatus for sensing down hole pressure and temperature and the like, that the apparatus must be small in size to effect the sensing operation. It follows therefore that the reduction in size of any element in the apparatus, such as the code wheel, is of prime importance.

Figure 4:
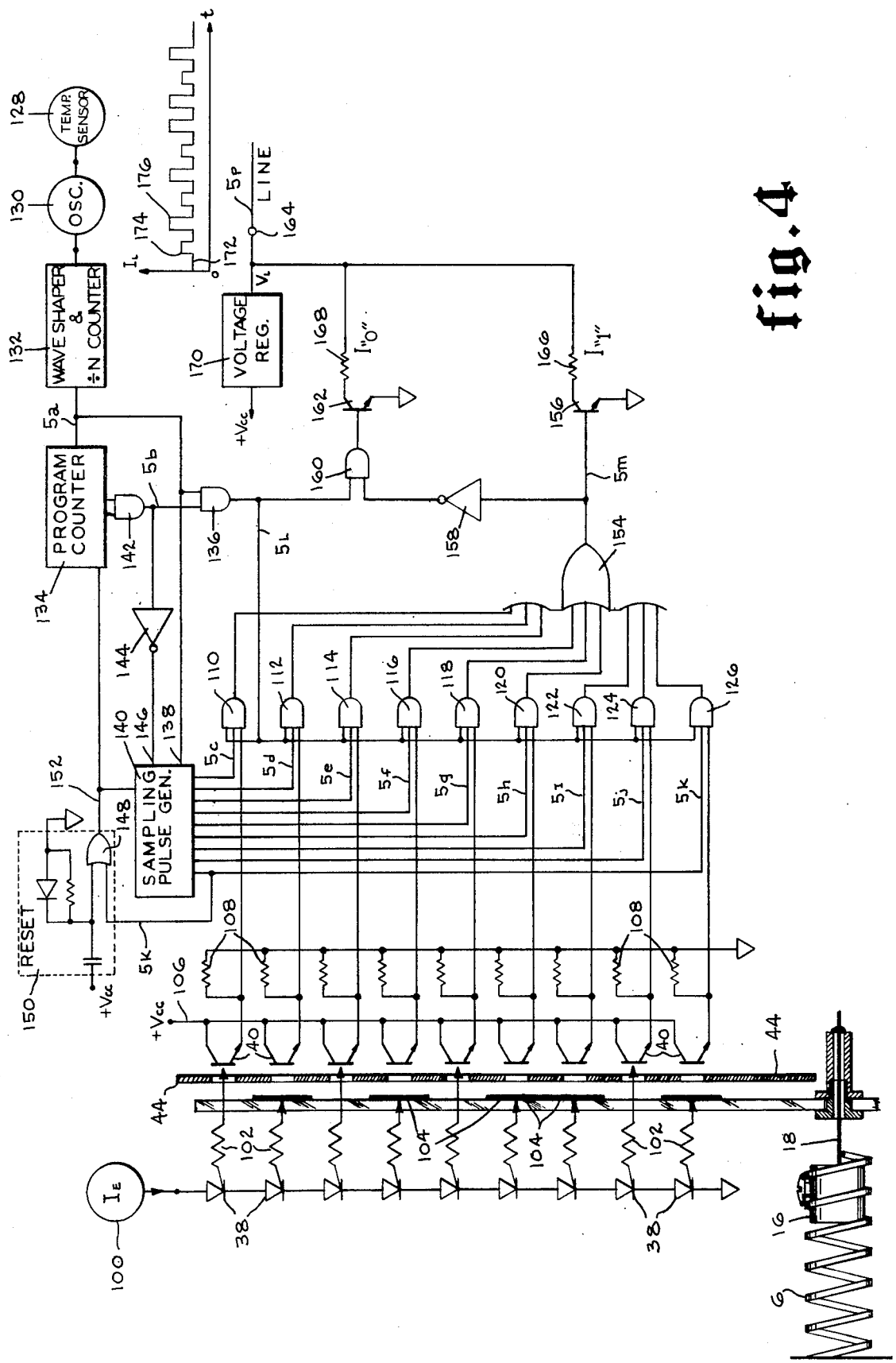
FIG. 4 is a schematic and block diagram representation of a digital logic circuit for coding sensed environmental conditions according to the present invention.

Refer now to FIG. 4 which is a schematic and block diagram representation of a digital logic circuit which is used to provide a digital output word indicative of the two environmental conditions sensed, namely the pressure and the temperature. The symbols 5A through 5P found on FIG. 4 are indicative of the circuit points at which the waveshapes as illustrated by FIGS. 5A through 5P respectively are manifested in the circuit of FIG. 4. The waveshapes illustrate the operation of the circuit for one pressure sensed at two different temperatures. That is, the left-most portion of the diagrams illustrate the timing for the one pressure at a temperature $T_1$, and the right-most portion of the diagrams illustrate the timing for the one, i.e. the same, pressure at a temperature $T_2$. The Bourdon tube 6 is connected to the code wheel by way of the wire 18 and the coupler 16 as was previously described. The radiant energy transmitters 38, which in practice may take the form of gallium arsenide light emitting diodes, are illustrated in schematic form and are connected in series to a source of operating current 100. The outputs of the respective diodes are illustrated schematically by way of radiant energy source or infra red light 102 in alignment with the respective code indicating concentric bands along the code wheel with the uppermost diode being aligned with the outermost or least significant bit band on the code wheel, with the lowermost or most significant bit band being aligned with the most significant bit concentric band on the code wheel. The metallized or masked regions are indicated by the shaded regions such as 104 in the diagram. It is seen therefore that the code wheel is positioned in a nine bit configuration indicative of a sensed pressure wherein the code is 101010010. The light sensors 40 are illustrated in schematic form and may for example be light responsive transistors as indicated or photodiodes or the like, all of which are readily available as off the shelf items. The collectors of the transistors forming the respective light sensors are connected in parallel to a source of operating potential 106. Each of the emitter electrodes of the respective transistors are connected in parallel to circuit ground by way of resistors 108. It is seen that when a given light sensor senses light, the transistors become conductive and an output signal is developed across its associated resistor which is indicative of a logic-one signal condition, that is the sensing of light. Conversely, if light is not sensed a signal is not developed which is indicative of a logic-zero condition. The respective outputs of the light sensors are connected to respective first inputs of AND gates 110–126. These respective gates are sampled at successive time intervals to determine the sensing conditions of their associated light sensors 40. The description of the control or timing network for controlling the sampling of these gates follows.

A temperature sensing device 128 is housed in the Bourdon tube housing for sensing the temperature therein and is connected to a temperature responsive oscillator 130 which provides timing signals or pulses at its output which have a duration or width which is determined by the temperature sensed. Stated in another way, the temperature sensed controls the frequency of the signal provided at the output of the oscillator 130. It follows that for a temperature $T_1$ the output of the oscillator is at a first frequency $F_1$ and for a different temperature $T_2$ the output of the oscillator is at a second frequency $F_2$. The signal output from the oscillator 130 is provided to the input of a waveshaper and divide by N counter 132 which provides a pulse train of a squarewave nature at its output, with the duration of the respective pulses and the frequency thereof being determined by the frequency output of the oscillator 130. This pulse train (FIG. 5A) is provided as a signal input to a program counter 134, and AND gate 136, and a first input 138 of a sampling pulse generator 140. The program counter is well known in the art and may take any one of many different physical forms. In any event it counts the input pulses from the counter 132. Connected to respective output terminals of the program counter 134 is an AND gate 142 which is connected to provide an output enable pulse for a predetermined time interval, that is a predetermined count time of the program counter. The signal output from the gate 142 (FIG. 5B) is applied to inputs of the gate 136 and an inverting device 144, with the output of the device 144 being connected to the second input 146 of the sampling pulse generator 140. The output from the AND gate 136 (FIG. 5L) is the pulse output from the counter 132 during the enable time interval as determined by the signal output from the gate 142. The output from the gate 136 is connected to second inputs of the gates 110 through 126 for providing a gating signal such that the output from the respective gates provide a signal output having a duration equal to the duration of a pulse from the counter 132 whenever the gates 110 through 126 are enabled as determined by the respective inputs from the sampling pulse generator 140 and the sensors 40. The sampling pulse generator 140 may take many different logic forms and for example may take the form of a counter and associated gates. In relation to FIGS. 5C–5K it is seen that the gates 110 through 126 are successively enabled for sensing the binary condition of the respective radiant energy sensors which are connected thereto for sensing the down hole pressure. The sampling pulse at bit time 9 (FIG. 5K) which is applied to the input of gate 126 is also applied to the input of an OR gate 148 in a reset circuit 150 for providing a reset signal on a line 152 for resetting the program counter 134 and the sampling pulse generator 140 for initiating each consecutive cycle of operation.

The respective outputs of the gates 110 through 126 are connected to respective inputs of an OR gate 154. In accordance with known operation of an OR gate the signal appearing at the output thereof (FIG. 5M) is representative of the successively sensed binary conditions of the respective gates 110 through 126. The pulse output indications from the gate 154 as illustrated by FIG. 5M are indicative of sensed binary one conditions, and it follows that the intervals in the binary work where there is no pulse is indicative of a binary zero condition. The output of the OR gate 154 is connected to the base electrode of an NPN transistor 156 and to the input of an inverter 158. The output signal from the inverter 158 is a train of pulses which are indicative of the time intervals at which a binary zero indication is sensed, and these signals are connected to an input of an AND gate 160 which has a second input connected to the output of the AND gate 136. It follows therefore that the signal appearing at the output of the AND gate 160 (FIG. 5N) is a series of pulses, which pulses are indicative of the time interval at which binary zero indications are sensed as controlled by the timing of the gate 136. The output of the AND gate 160 is connected to the base electrode of an NPN transistor 162. The emitter electrodes of the transistors 156 and 162 are connected to circuit ground, and the collector electrodes thereof are connected to an output terminal 164 by way of resistors 166 and 168 respectively. The latter resistors are also connected to a source of regulated voltage 170 which controls the reference output current appearing at the terminal 164. The resistor 166 is chosen to have an impedance which is larger than the impedance of the resistor 168 such that it may be readily seen when a given one of the transistors is conducting. In an interval of time when neither of the transistors is conductive the output current appearing at the terminal 164 is at a predetermined reference level as indicated at 172. When the transistor 156 becomes conductive which is indicative of a binary one condition for a given interval of time a given amount of current flows through the resistor 166 and a current pulse of a first amplitude indicative of a binary one indication is manifested at the terminal 164 as indicated by the pulse 174. When the transistor 162 is conductive which is indicative of a binary zero condition a greater amount of current is drawn since the resistor 168 is smaller than the resistor 166 and a current pulse as indicated at 176 is manifested at the output terminal 164. It follows that the sequence of bits is indicative of the pressure sensed whereas the duration or width of the bits, that is the frequency of the message is indicative of the temperature sensed.

The effect of the temperature sensed on the output word is more readily seen in relation to FIGS. 5A through 5P. FIG. 5A illustrates the output from the counter 132 at temperatures $T_1$ and $T_2$, and it is seen that the duration of the pulses is less at temperature $T_1$ than the duration of the pulses at temperature $T_2$. Stated another way, it is seen that the frequency of the pulses at temperature $T_1$ are higher than the frequency of the pulses at temperature $T_2$. Since the operation of the remaining counters and gates in the logic network are controlled by the output of the counter 132 it is readily apparent from the remaining waveshapes illustrated that the duration or frequency of the output word changes while the bit sequence remains the same for a given sensed pressure as indicated by FIG. 5P which is a return-to-base current waveform.

In summary environmental condition sensing apparatus has been disclosed which provides a digital output word which describes two environmental conditions, namely, pressure and temperature, wherein the code sequence, that is the sequence of bits in the binary word, is indicative of the pressure sensed, and the code frequency, that is the duration of the bits in the message, is indicative of the temperature sensed. It is to be appreciated that the pressure sensing apparatus disclosed may be used with logic networks other than the one illustrated, and conversely the logic network disclosed may be used with pressure sensing apparatus other than the one illustrated.

I claim:

1. Environmental condition responsive apparatus comprising:
   means for sensing a first environmental condition, including means for providing a binary coded word having at least two distinct code states the permutation sequence of said code states indicative of the first environmental condition sensed,
   means for sensing a second environmental condition, including means for providing a timing signal having a frequency indicative of the second environmental sensed, and
   means connected to receive said timing signal and said binary coded word for providing a composite signal indicative of the said first and second environmental condition, said composite signal having a code permutation sequence indicative of the first environmental condition sensed and a binary code sequence frequency indicative of the second environmental condition sensed.

2. Environmental condition responsive apparatus, comprising:
   means for sensing a first environmental condition, including a movable portion which moves in response to the first environmental condition being sensed;
   binary coding means operative with the movable portion of said means for sensing for providing a binary coded word having a plurality of binary bits having a permutation sequence indicative of the first environmental condition sensed;
   means for sensing a second environmental condition, including means for providing timing signals having a pulse rate indicative of the second environmental condition sensed; and
   means for providing a binary coded environmental condition indicating signal in response to the concurrent provision of said binary coded word and said timing signals, wherein said binary coded environmental condition indicating signal has a permutation sequence of bits indicative of the first environmental condition sensed and has a bit pulse rate indicative of the second environmental condition sensed.

3. The combination claimed in claim 2, wherein the first environmental condition is pressure, and the second environmental condition is temperature.

4. Environmental condition responsive apparatus comprising:
   means for sensing one environmental condition, including a movable portion which moves in response to the one environmental condition being sensed;
   a source of radiant energy;
   coding means in the path of said radiant energy and operative with the movable portion of said means for sensing, and coded for passing certain portions and blocking other portions of the radiant energy dependent upon the amount the movable portion has moved;
   radiant energy responsive means operative with said coding means for sensing the passing or blocking of radiant energy for providing a binary code signal, said binary code signal having a plurality of distinct voltage levels, the permutation of said levels indicative of the amount of movement of the movable portion of said means for sensing;
   means for sensing a second environmental condition, including means for providing timing signals having a frequency indicative of the second environmental condition sensed; and
   means for providing a binary coded environmental condition indicating signal in response to the concurrent provision of the signal provided by said radiant energy responsive means and said timing signals, wherein the permutations of the binary code signal are indicative of the one environmental condition sensed, and the binary code signal frequency is indicative of the second environmental condition sensed.

5. The combination claimed in claim 4 wherein the one environmental condition is pressure and the second environmental condition is temperature.

6. The combination claimed in claim 5 wherein said means for sensing one environmental condition comprises a Bourdon tube.

7. The combination claimed in claim 6 wherein said means for providing timing signals includes a temperature responsive oscillator.

8. Environmental condition responsive apparatus comprising:
   a housing;
   a Bourdon tube mounted in said housing for rotating in response to a pressure being sensed;
   a two sided code wheel coupled to said Bourdon tube for rotating with said Bourdon tube, said code wheel being coded such that a selected code pattern is affixed thereto in concentric bands with the outermost band being the least significant bit indication and the innermost band being the most significant bit indication, with the bands being divided into transparent regions indicative of one binary condition and opaque regions indicative of the other binary condition;

a plurality of radiant energy sources equal in number to the concentric bands on said code wheel, and including means for attaching said sources to said housing with respect to one side of said code wheel in specified alignment with said code wheel such that each source is optically aligned with a different one of said concentric bands;

a plurality of radiant energy sensors equal in number to said sources, and including means for attaching said sensors to said housing with respect to the other side of said code wheel in optical alignment with said code wheel such that each sensor is optically aligned with a different one of said concentric bands for sensing the light transmitted by the source optically aligned with the same band;

a plurality of gating windows equal in number with said concentric bands and interposed between said code wheel and said sensors, and each window having an opening therein of specified width, said opening being optical alignment with respect to said sources and sensors;

signal utilization means responsive to the radiant energy sensed by said sensors for forming a binary coded signal output having a sequence of bits indicative of the pressure sensed;

wherein said signal utilization means comprises;

means for sensing the temperature in said housing, including means for providing timing signals having a pulse rate indicative of the temperature sensed; and means for providing a binary coded pressure and temperature signal, wherein the sequence of bits is indicative of the pressure sensed and the pulse rate of the bits is indicative of the temperature sensed, in response to the concurrent provision of said binary coded signal output and said timing signals.

9. The combination claimed in claim 8, wherein said sensors are in radial alignment with said code wheel such that certain ones of said sensors are aligned with a given radius of said code wheel, while other ones of said sensors are aligned with a different radius of said code wheel.

10. The combination claimed in claim 8, wherein a first plurality of said sensors are aligned with every other one of said concentric bands along a given radius, and the remaining ones of said sensors are aligned with the remaining ones of said concentric bands along a second radius.

11. The combination claimed in claim 8, wherein said means for providing a binary coded pressure and temperature signal comprises:

a temperature sensor;

an oscillator operative with said temperature sensor and which provides output pulses whose frequency is controlled by the temperature sensed by said temperature sensor;

a counter which counts in response to the provision of the output pulses from said oscillator;

a plurality of gates, with each gate being responsive to the signal sensed by a different one of said radiant energy sensors, with each gate being sampled at a time determined by successive counts of said counter with the output signal of a given gate when sampled being at a binary one level in response to radiant energy being sensed, and being at a binary zero level in response to radiant energy not being sensed by the radiant energy sensor operative therewith; and means responsive to the respective output signals from said plurality of gates for providing said binary coded pressure and temperature signal.

* * * * *

UNITED STATES PATENT AND TRADEMARK OFFICE
CERTIFICATE OF CORRECTION

PATENT NO. : 3,968,691
DATED : July 13, 1976
INVENTOR(S) : Hayati Balkanli

It is certified that error appears in the above-identified patent and that said Letters Patent are hereby corrected as shown below:

Col. 5, line 50, "and" should be --an--

Col. 6, line 28, "work" shoulde be --word--

Col. 9, line 23, after "being" insert --in--

Col. 9, line 24, after "and" insert --said--

Signed and Sealed this

Twenty-first Day of September 1976

[SEAL]

Attest:

RUTH C. MASON
*Attesting Officer*

C. MARSHALL DANN
*Commissioner of Patents and Trademarks*